(12) United States Patent
Wang et al.

(10) Patent No.: US 12,289,897 B2
(45) Date of Patent: Apr. 29, 2025

(54) MAGNETIC MEMORY DEVICE AND METHOD FOR FORMING THE SAME

(71) Applicant: UNITED MICROELECTRONICS CORP., Hsin-Chu (TW)

(72) Inventors: Hui-Lin Wang, Taipei (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 531 days.

(21) Appl. No.: 17/676,213

(22) Filed: Feb. 20, 2022

(65) Prior Publication Data
US 2023/0232637 A1    Jul. 20, 2023

(30) Foreign Application Priority Data
Jan. 14, 2022   (CN) .......................... 202210042078.4

(51) Int. Cl.
| | | |
|---|---|---|
| H01L 43/12 | (2006.01) |
| H01L 27/22 | (2006.01) |
| H01L 43/02 | (2006.01) |
| H10B 61/00 | (2023.01) |
| H10N 50/01 | (2023.01) |
| H10N 50/80 | (2023.01) |
| H10N 50/85 | (2023.01) |

(52) U.S. Cl.
CPC ............. *H10B 61/00* (2023.02); *H10N 50/01* (2023.02); *H10N 50/80* (2023.02); *H10N 50/85* (2023.02)

(58) Field of Classification Search
CPC ......... H10N 50/10; H10N 50/80; H10B 61/00
See application file for complete search history.

(56) References Cited

U.S. PATENT DOCUMENTS

| | | | | |
|---|---|---|---|---|
| 2019/0305217 A1* | 10/2019 | Xue | ...................... | H10B 61/10 |
| 2020/0006425 A1* | 1/2020 | Lin | ........................ | H10N 50/01 |
| 2021/0257541 A1* | 8/2021 | Kariyada | ............... | H10B 61/00 |
| 2022/0158087 A1* | 5/2022 | Kuo | ........................ | H10B 61/00 |

* cited by examiner

*Primary Examiner* — Kyoung Lee
*Assistant Examiner* — David J Goodwin
(74) *Attorney, Agent, or Firm* — Winston Hsu

(57) ABSTRACT

A magnetic memory device includes a bottom electrode layer, a magnetic tunneling junction (MTJ) stack disposed on the bottom electrode layer, a dielectric cap layer disposed on the MTJ stack, and a metal cap layer disposed on the dielectric cap layer, wherein the metal cap layer comprises a plurality of first metal layers and second metal layers alternately stacked on the dielectric cap layer.

10 Claims, 5 Drawing Sheets

FIG. 1

MAGNETIC MEMORY DEVICE AND METHOD FOR FORMING THE SAME

BACKGROUND OF THE INVENTION

1. Field of the Invention

The present invention generally relates to a magnetic memory device and method for forming the same. More particularly, the present invention relates to a magnetoresistive random access memory (MRAM) including a metal cap layer with a multilayer structure and a method for forming the same.

2. Description of the Prior Art

A magnetoresistive random access memory (MRAM) is a kind of non-volatile memory that has drawn a lot of attention in this technology field recently regarding its potentials of incorporating advantages of other kinds of memories. For example, a MRAM device may have an operation speed comparable to SRAMs, the non-volatile feature and low power consumption comparable to flash, the high integrity and durability comparable to DRAM. More important, the process for forming a MRAM device may be conveniently incorporated into existing semiconductor manufacturing processes.

A typical MRAM cell structure usually includes a memory stack structure including a magnetic tunneling junction (MTJ) disposed between the lower and upper electrodes. Unlike conventional memories that store data by electric charge or current flow, an MRAM cell stores data by applying external magnetic fields to control the magnetic polarity and tunneling magnetoresistance (TMR) of the MTJ. A well-controlled tunneling magnetoresistance of an MRAM cell is critical for the MRAM cell to function properly. It is important to prevent impurities (such as ambient gas or elements of other material layers) from diffusing into the MTJ of the MRAM cell when manufacturing a magnetoresistive random access memory because the diffused impurities may cause abnormal tunneling magnetoresistance.

SUMMARY OF THE INVENTION

In light of the above, the present invention is directed to provide a magnetic memory device which includes a metal cap layer with a multilayer structure, and a method for forming the same. The metal cap layer may provide a better protection to prevent impurities from diffusing into the underlying magnetic tunneling junction stack, so that device failure due to abnormal tunneling magnetoresistance may be reduced.

One aspect of the invention provides a magnetic memory device including a bottom electrode layer, a magnetic tunneling junction (MTJ) stack disposed on the bottom electrode layer, a dielectric cap layer disposed on the MTJ stack, and a metal cap layer disposed on the dielectric cap layer, wherein the metal cap layer comprises a plurality of first metal layers and second metal layers alternately stacked on the dielectric cap layer.

Another aspect of the invention provides a method for forming a magnetic memory device including the steps of forming a magnetic tunneling junction (MTJ) stack on a bottom electrode layer, forming a dielectric cap layer on the MTJ stack, and forming a metal cap layer on the dielectric cap layer, wherein the metal cap layer comprises a plurality of first metal layers and second metal layers alternately stacked on the dielectric cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic cross-sectional diagrams of a magnetic memory device at different steps of a manufacturing process according to an embodiment of the present invention.

DETAILED DESCRIPTION

Figure 2:
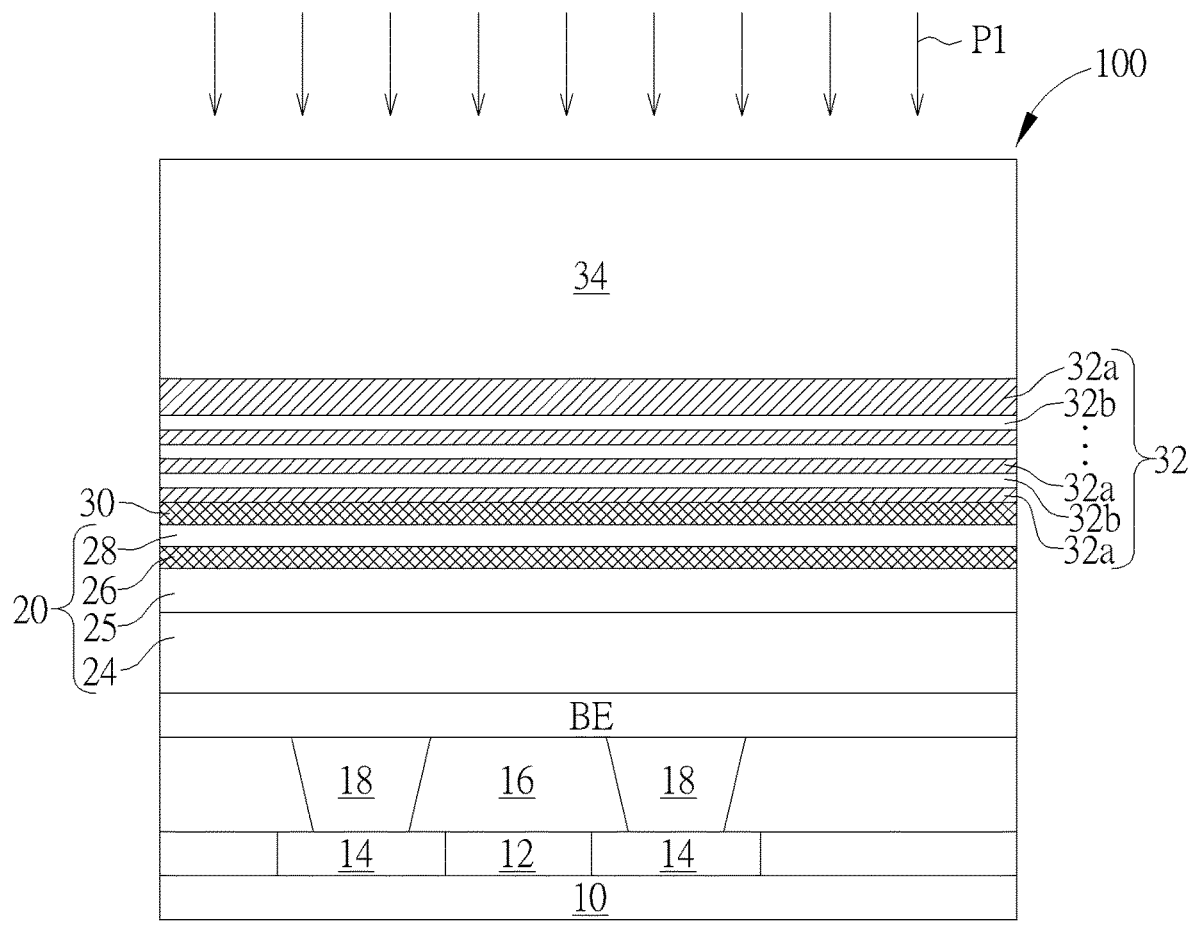

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

Figure 1:
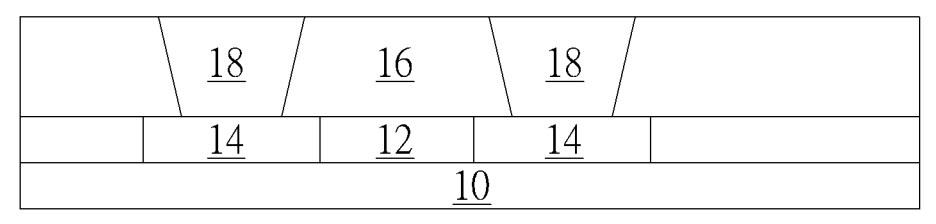

Please refer to FIG. 1 to FIG. 4, which are schematic cross-sectional diagrams showing a magnetic memory device at different steps of a manufacturing process according to an embodiment of the present invention. At the beginning of the manufacturing process, as shown in FIG. 1, a substrate 10 is provided. The substrate 10 may be a silicon substrate, a silicon-on-insulator (SOI) substrate, or a Group III-V semiconductor substrate, but is not limited thereto. The substrate 10 may include semiconductor devices formed therein, such as transistors, capacitors, resistors, inductors, or other active or passive semiconductor devices, which are not shown in the diagrams for the sake of simplification. Following, at least a dielectric layer and interconnect structures disposed in the dielectric layer may be formed on the substrate 10. For example, as shown in FIG. 1, a dielectric layer 12 having interconnect structures 14 (such as metal interconnect structures) formed therein may be formed on the substrate 10, and another dielectric layer 16 having interconnect structures 18 (such as contact vias) formed therein are then formed on the dielectric layer 12. The dielectric layer 12 and the dielectric layer 16 may respectively include silicon oxide ($SiO_2$) or a suitable low-k dielectric material such as fluorinated silica glass (FSG), silicon oxycarbide (SiCOH), spin-on-glass, porous low-k dielectric material, organic dielectric polymers, or a combination thereof, but is not limited thereto. The interconnect structures 14 and the interconnect structures 18 may respectively include a conductive metal or a metal compound, such as tungsten (W), copper (Cu), aluminum (Al), titanium (Ti), tantalum (Ta), titanium nitride (TiN), tantalum nitride (TaN), or a combination thereof, but is not limited thereto.

Please refer to FIG. 2. Subsequently, a stack structure 100 is formed on the substrate 10. The stack structure 100 may include (sequentially from the bottom that is close to the substrate 10 to the top that is away from the substrate 10) a bottom electrode layer BE, a magnetic tunneling junction (MTJ) stack 20, a dielectric cap layer 30, a metal cap layer 32, and a hard mask layer 34. After that, an anneal process P1 may be performed to increase the perpendicular magnetic anisotropy (PMA) of the magnetic tunneling junction stack 20. According to an embodiment of the present invention, the temperature of the anneal process P1 may be between 350° C. and 450° C., and a process time of the anneal process P1 may be between 30 minutes and 5 hours, but is not limited thereto.

The bottom electrode layer BE is disposed on the dielectric layer 16 and directly contacts the interconnect structures 18. The bottom electrode layer BE may include a conductive metal or a metal compound, such as titanium (Ti), tantalum (Ta), titanium nitride (TiN), tantalum nitride (TaN), or a combination thereof, but is not limited thereto.

The magnetic tunneling junction stack 20 has a multilayer structure that includes (sequentially from the bottom that is close to the substrate 10 to the top that is away from the substrate 10) a reference layer 24, a pinned layer 25, a tunneling barrier layer 26, and a free layer 28. The reference layer 24 may include an anti-ferromagnetic (AFM) material such as PtMn, IrMn, PtIr, other suitable anti-ferromagnetic materials, or a combination thereof, but is not limited thereto. The reference layer 24 is used to pin or fix nearby ferromagnetic layers to a particular magnetic polarity. The pinned layer 25 and the free layer 28 may respectively include a ferromagnetic material, such as Fe, Co, Ni, FeNi, FeCo, CoNi, FeB, FePt, FePd, CoFeB, or the like, but are not limited thereto. The magnetic polarity of the pinned layer 25 is fixed (anti-ferromagnetic coupled) by the reference layer 24, while the magnetic polarity of the free layer 28 may be changed by an external magnetic field. The tunneling barrier layer 26 is sandwiched between the pinned layer 25 and the free layer 28 and may include a metal oxide such as MgO, $Al_2O_3$, NiO, GdO, $Ta_2O_5$, $MoO_2$, $TiO_2$, $WO_2$, or a combination thereof, but is not limited thereto. According to an embodiment of the present invention, the tunneling barrier layer 26 includes MgO. The reference layer 24, the pinned layer 25, the tunneling barrier layer 26 and the free layer 28 may respectively have a single layer or a multilayer structure, and each layer may have a thickness approximately between several angstroms (Å) to several tens of nanometers (nm).

The dielectric cap layer 30 may be directly disposed on the free layer 28 of the magnetic tunneling junction stack 20 to provide protection to the magnetic tunneling junction stack 20. The dielectric cap layer 30 may include a metal oxide such as MgO, $Al_2O_3$, NiO, GdO, $Ta_2O_5$, $MoO_2$, $TiO_2$, $WO_2$, or a combination thereof, but is not limited thereto. According to an embodiment of the present invention, the dielectric cap layer 30 includes MgO.

The metal cap layer 32 may be directly disposed on the dielectric cap layer 30, or may be disposed on a buffer layer (such as the buffer layer 31 shown in FIG. 5) on the dielectric cap layer 30. The metal cap layer 32 has a multilayer structure that includes a plurality of first metal layers 32a and a plurality of second metal layers 32b alternately stacked on the dielectric cap layer 30, wherein the topmost layer and the bottommost layer of the multilayer structure of the metal cap layer 32 are the first metal layers 32a. The second metal layers 32b are respectively sandwiched between two of the first metal layers 32a. According to an embodiment of the present invention, the metal cap layer 32 may include n+1 numbers of first metal layers 32a and n numbers of second metal layers 32b, wherein n is a positive integer greater than or equal to 2. When the metal cap layer 32 is directly disposed on the dielectric cap layer 30, the dielectric cap layer 30 is in direct contact with the bottommost first metal layers 32a of the metal cap layer 32. The first metal layers 32a may include a metal material with a good conductivity and able to protect the underlying layers from being oxidized. In a preferred embodiment, the first metal layers 32a include ruthenium (Ru) which may react with oxygen (such as ambient oxygen) to form a dense ruthenium oxide film on the surface. The surface ruthenium oxide film may block oxygen penetration, so that the underlying material layers may be well protected from being oxidized. Furthermore, ruthenium oxide still has good conductivity and would not evidently influence the resistance of the magnetic memory device. The second metal layers 32b may respectively include a metal material that is able to react with the material of the first metal layers 32a (the portion not being oxidized) to form an alloy during a thermal process (such as the anneal process P1). By turning the first metal layers 32a into alloy, the problems of abnormal tunneling magnetoresistance due to diffusion of the material of the first metal layers 32a into the magnetic tunneling junction stack 20 may be prevented. According to an embodiment of the present invention, when the first metal layers 32a include ruthenium (Ru), preferably, the second metal layers 32b may respectively include vanadium (V), manganese (Mn), zinc (Zn), molybdenum (Mo), tantalum (Ta), tungsten (W), rhenium (Re), osmium (Os), or other metal materials that have an alloy forming enthalpy with ruthenium (Ru) approximately between −330 and −15 kJ/mol to react with ruthenium (Ru) to form alloy easily. According to an embodiment of the present invention, all of the first metal layers 32a of the metal cap layer 32 are made of ruthenium (Ru), and the second metal layers 32b of the metal cap layer 32 are respectively made of one selected from manganese (Mn), zinc (Zn), molybdenum (Mo), tantalum (Ta), and tungsten (W). According to another embodiment of the present invention, all of the second metal layers 32b of the metal cap layer 32 are made manganese (Mn). As shown in FIG. 2, the first metal layer 32a on the top of the metal cap layer 32 is used as the major oxygen blocking layer, and may have a thickness larger than thicknesses of the rest of the first metal layers 32a.

The hard mask layer 34 may be directly disposed on the metal cap layer 32 and is in direct contact with the first metal layer 32a on the top of the metal cap layer 32. The hard mask layer 34 may include a conductive metal or a metal compound, such as titanium (Ti), tantalum (Ta), titanium nitride (TiN), tantalum nitride (TaN), or a combination thereof, but is not limited thereto. According to an embodiment of the present invention, the hard mask layer 34 includes titanium nitride (TiN). The hard mask layer 34 may be used as an etch stop layer during a subsequent patterning process (such as the patterning process P2 shown in FIG. 3) to protect the underlying layers and help to form memory cells (such as the memory cells 35 shown in FIG. 3) with vertical sidewalls. The hard mask layer 34 may also be used as top electrodes of the memory cells.

During the anneal process P1, diffusion of atoms may occur in the stack structure 100. For example, nitrogen (N) atoms of the hard mask layer 34 made of TiN and ruthenium (Ru) atoms of the second metal layers 32b of the metal cap layer 32 tend to diffuse downward. The present invention disposes the second metal layers 32b made of Mn, Zn, Mo, Ta, or W between the first metal layers 32a to react with the Ru atoms of the first metal layers 32a to form alloy, so that no free Ru atoms may diffuse into the magnetic tunneling junction stack 20. The nitrogen (N) atoms may also be blocked from diffusing into the magnetic tunneling junction stack 20 by the second metal layers 32b, and the problems of nitridation of the ferromagnetic materials of the magnetic tunneling junction stack 20 may be resolved.

Figure 3:
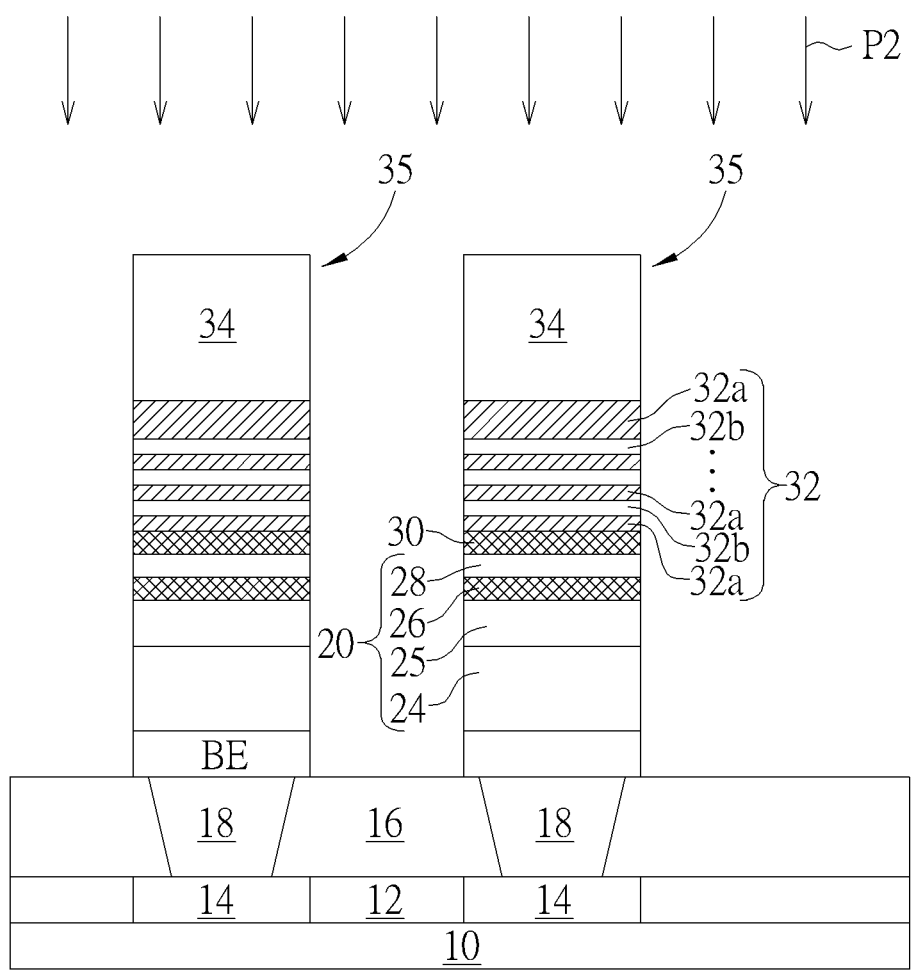

Please refer to FIG. 3. Subsequently, a patterning process P2 (such as a photolithography-etching process) is performed to pattern the stack structure 100 and remove unnecessary portions of the bottom electrode layer BE, the magnetic tunneling junction (MTJ) stack 20, the dielectric cap layer 30, the metal cap layer 32, and the hard mask layer 34, thereby obtaining a plurality of memory cells 35 respectively disposed on the interconnect structures 18.

Figure 4:
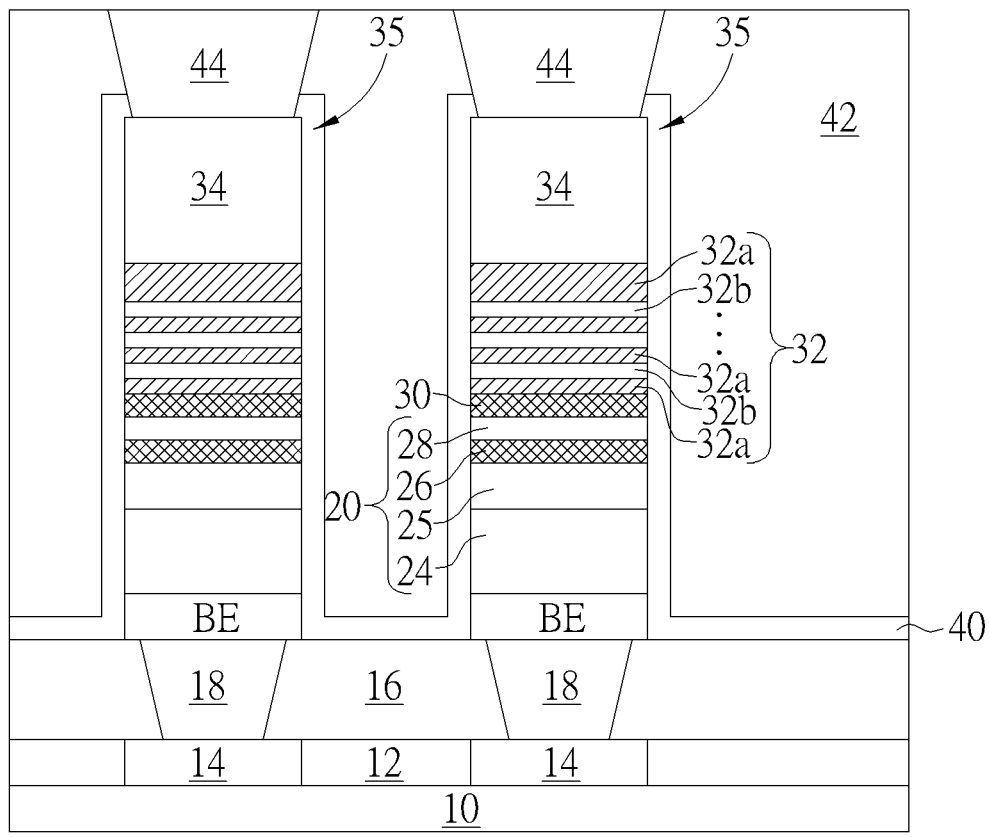

Please refer to FIG. 4. Subsequently, a passivation layer 40 may be conformally formed on the substrate 10 to cover the surface of the dielectric layer 16 and the top surfaces and sidewalls of the memory cells 35. Afterward, an interlayer dielectric layer 42 is formed on the passivation layer 40 in a blanket manner to cover the memory cells 35 and completely fill the spaces between the memory cells 35. The passivation layer 40 may include an insulating material, such as silicon nitride (SiN), silicon oxynitride (SiON), or carbon nitride (SiCN), but is not limited thereto. The interlayer dielectric layer 42 may include silicon oxide ($SiO_2$) or a suitable low-k dielectric material such as fluorinated silica glass (FSG), silicon oxycarbide (SiCOH), spin-on-glass, porous low-k dielectric material, organic dielectric polymers, or a combination thereof, but is not limited thereto. Following, a plurality of interconnect structures 44 are formed directly on the memory cells 35. The interconnect structures 44 respectively penetrate through the interlayer dielectric layer 42 and the passivation layer 40 to direct contact and electrically connect to the hard mask layers 34 (used as the top electrodes) of the memory cells 35. The interconnect structures 44 may include a conductive metal or a metal compound, such as tungsten (W), copper (Cu), aluminum (Al), titanium (Ti), tantalum (Ta), titanium nitride (TiN), tantalum nitride (TaN), or a combination thereof, but is not limited thereto.

Please continue to refer to FIG. 4, which shows a schematic cross-sectional diagram of a magnetic memory device provided by the present invention. The magnetic memory device includes a bottom electrode layer BE, a magnetic tunneling junction (MTJ) stack 20 disposed on the bottom electrode BE, a dielectric cap layer 30 disposed on the magnetic tunneling junction stack 20, a metal cap layer 32 disposed on the dielectric cap layer 30, and a hard mask layer 34 disposed on the metal cap layer 32. The metal cap layer 32 includes a plurality of alternately stacked first metal layers 32a and second metal layers 32b, wherein the topmost layer and the bottommost layer of the metal cap layer 32 are the first metal layers 32a, and the second metal layers 32b are respectively sandwiched between the first metal layers 32a. The multilayer design of the metal cap layer 32 that comprises alternating first metal layers 32a and second metal layer 32b wherein the first metal layers 32a preferably include ruthenium (Ru) and the second metal layer 32b preferably include at least one of manganese (Mn), zinc (Zn), molybdenum (Mo), tantalum At least one of (Ta) or tungsten (W) may effectively reduce the risk of oxidation and/or nitridation of the underlying magnetic tunneling junction stack 20.

Figure 5:
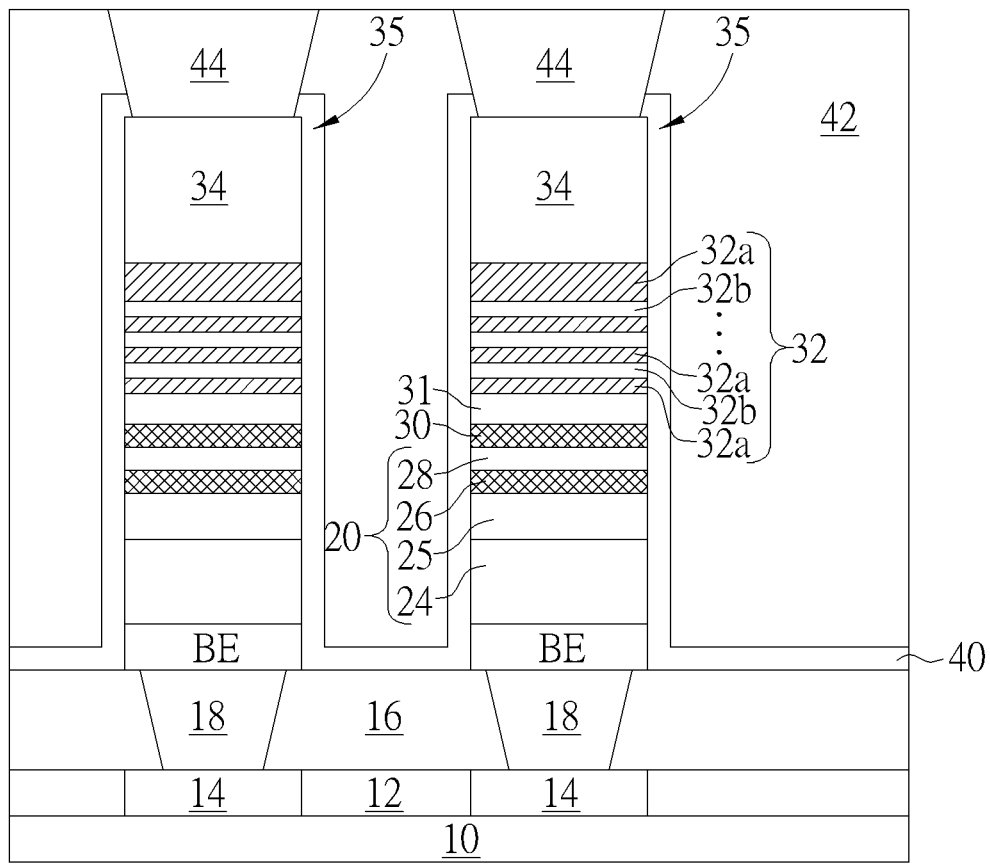
FIG. 5 is a schematic cross-sectional diagram of a magnetic memory device according to another embodiment of the present invention.

Please refer to FIG. 5, which is a schematic cross-sectional diagram of a magnetic memory device according to another embodiment of the present invention. The similar or corresponding features between the magnetic memory devices shown in FIG. 5 and FIG. 4 are labeled by the same reference numbers. Details of the features have been elaborated in previous paragraphs and would not be repeated again. A difference between the magnetic memory device shown in FIG. 5 and the magnetic memory device shown in FIG. 4 is that the magnetic memory device shown in FIG. 5 further includes a buffer layer 31 disposed between the dielectric cap layer 30 and the metal cap layer 32 and is in direct with the bottommost first metal layer 32a of the metal cap layer 32. The buffer layer 31 may reduce the influence on the magnetic tunneling junction 20 caused by the stress of the metal cap layer 32 and the hard mask layer 34. The buffer layer 31 may include a ferromagnetic material, such as Fe, Co, Ni, FeNi, FeCo, CoNi, FeB, FePt, FePd, CoFeB, or the like, but are not limited thereto. According to an embodiment of the present invention, the buffer layer 31 may include CoFeB.

In summary, by forming a metal cap layer 32 with a multilayer structure between the dielectric cap layer 30 and the hard mask layer 34, the magnetic memory device provided by the present invention may prevent oxygen and/or atoms of the hard mask layer 34 penetrating into the magnetic tunneling junction stack 20, so that problems of abnormal tunneling magnetoresistance may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory device, comprising:
   a bottom electrode layer;
   a magnetic tunneling junction (MTJ) stack disposed on the bottom electrode layer;
   a dielectric cap layer disposed on the MTJ stack; and
   a metal cap layer disposed on the dielectric cap layer, wherein the metal cap layer comprises a plurality of first metal layers and second metal layers alternately stacked on the dielectric cap layer, wherein the first metal layers respectively comprise Ru, the second metal layers respectively comprise Mn, Zn, or W.

2. The magnetic memory device according to claim 1, wherein each of the second metal layers are sandwiched between two of the first metal layers.

3. The magnetic memory device according to claim 1, wherein the second metal layers comprise Mn.

4. The magnetic memory device according to claim 1, wherein the dielectric cap layer directly contacts one of the first metal layers.

5. The magnetic memory device according to claim 1, wherein the dielectric cap layer comprises MgO.

6. The magnetic memory device according to claim 1, further comprising a hard mask layer disposed on the metal cap layer and directly contacting one of the first metal layers.

7. The magnetic memory device according to claim 6, wherein the hard mask layer comprises TiN.

8. The magnetic memory device according to claim 1, wherein among the first metal layers, a thickness of the first metal layer on the top of the metal cap layer is larger than thicknesses of the rest of the first metal layers.

9. The magnetic memory device according to claim 1, further comprising:

a buffer layer disposed between the dielectric cap layer and the metal cap layer, wherein the buffer layer directly contacts one of the first metal layers.

10. The magnetic memory device according to claim 9, wherein the buffer layer comprises CoFeB.

* * * * *